Figure 1:
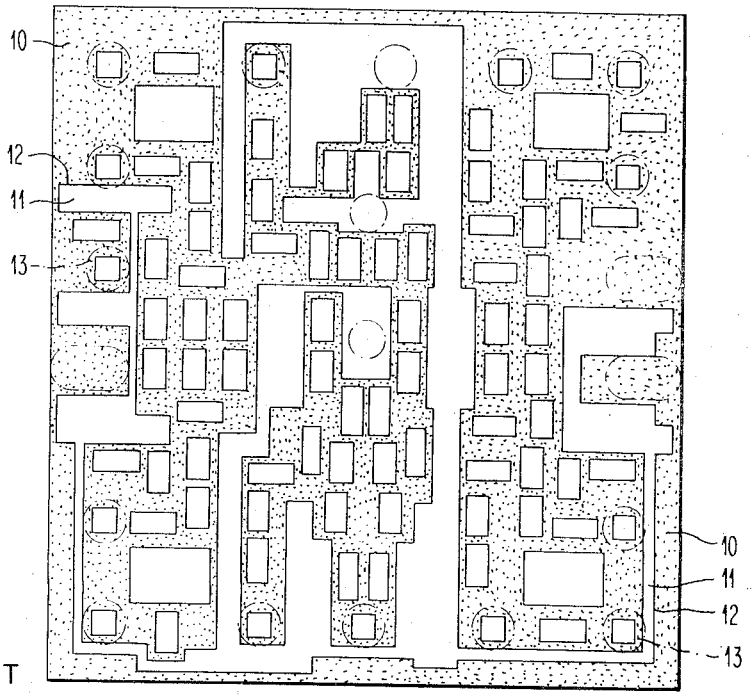
PRIOR ART FIG. 1
Figure 1A:
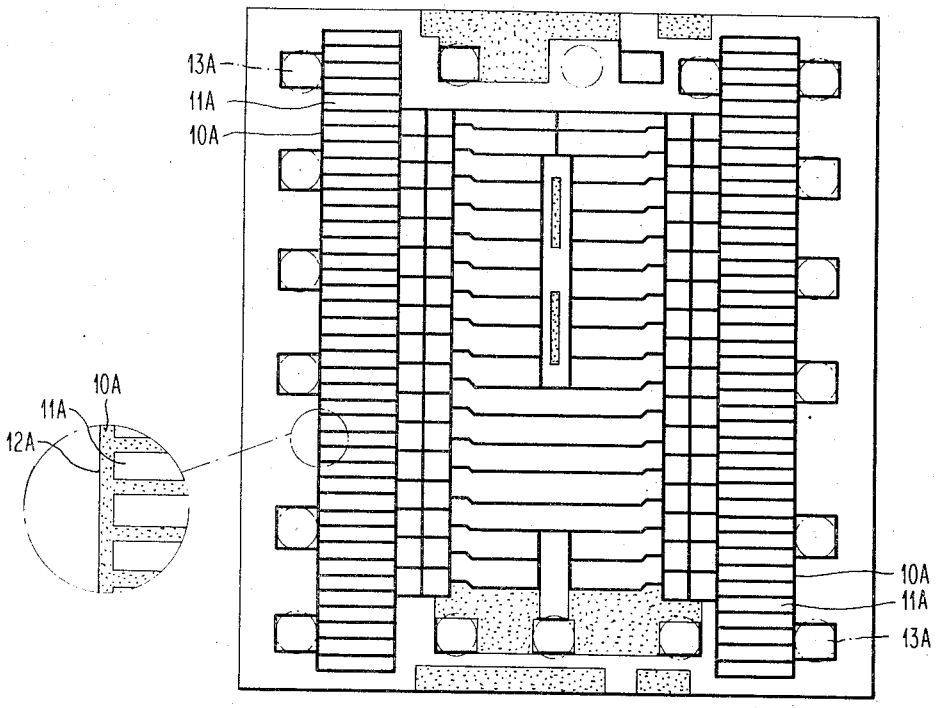
Figure 2:
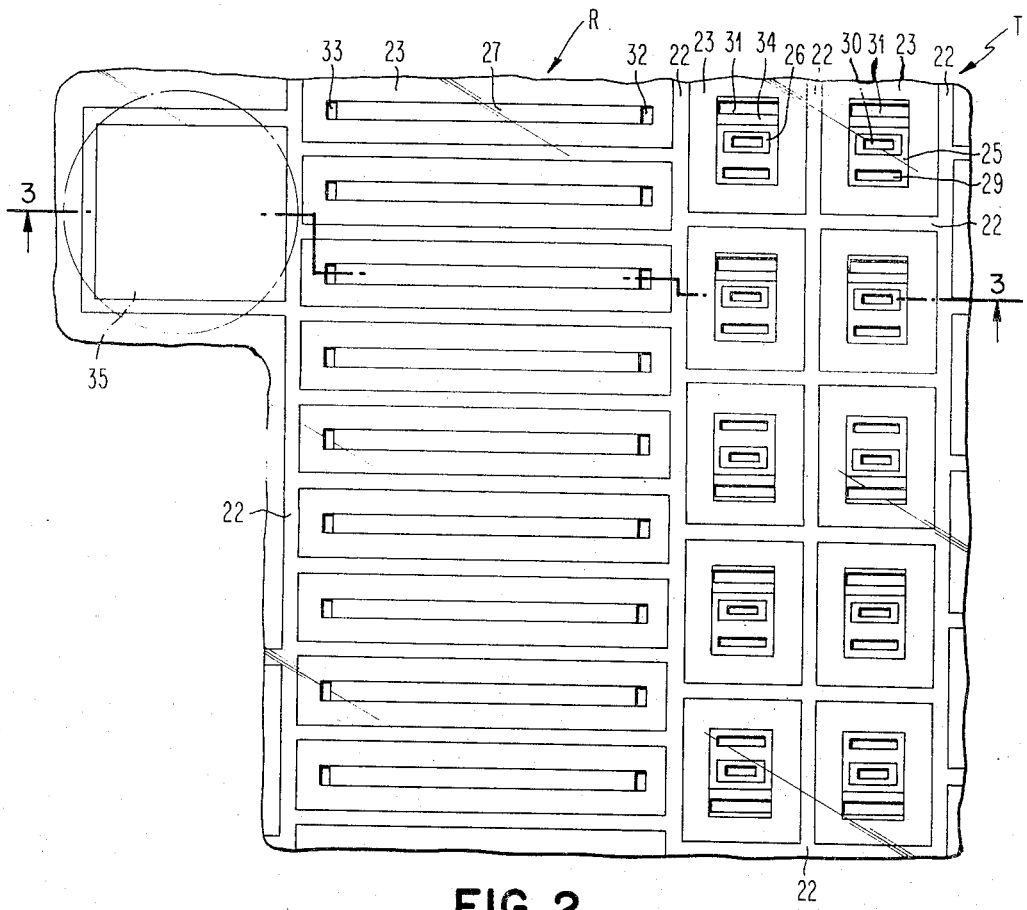
Figure 3:
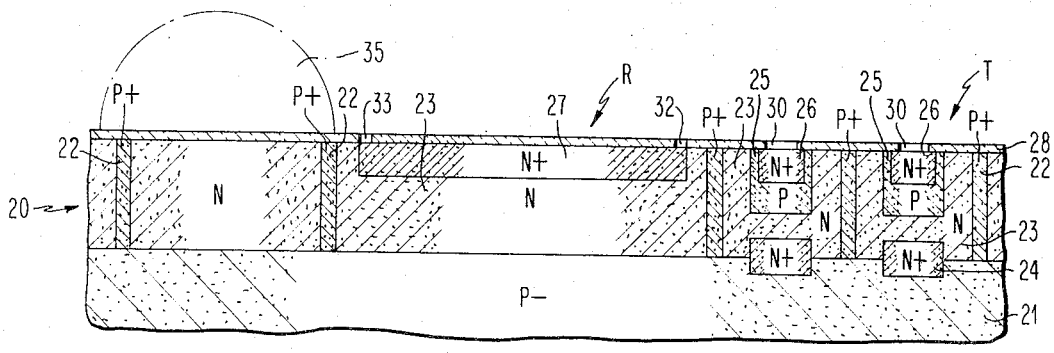

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 1, 1974

918 O.G. 105

T918,007
INTEGRATED CIRCUIT JUNCTION ISOLATION STRUCTURE

Mario A. Battista, Ridgefield, Conn., and Larry E. Freed, Poughkeepsie, and Richard S. Harbison, William J. Nestork, and James R. Struk, Wappingers Falls, and Daniel Tuman, Beacon, N.Y., assignors to International Business Machines, Inc., Armonk, N.Y.

Continuation of application Ser. No. 239,173, Mar. 29, 1972. This application June 6, 1973, Ser. No. 367,603
**Int. Cl. H01l *5/00***
U.S. Cl. 317—235
2 Sheets Drawing. 11 Pages Specification

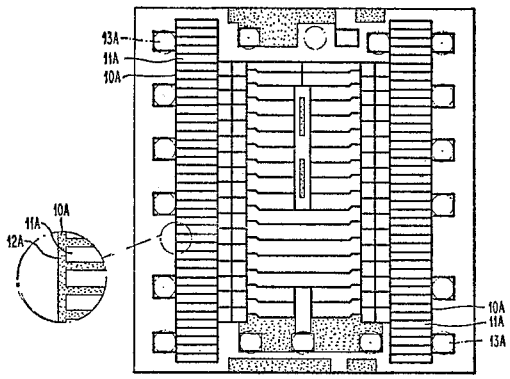

A planar monolithic semiconductor integrated circuit masterslice structure comprising a surface from which a plurality of regions of different conductivity types extend into the chip to provide the active and passive devices of the circuit and having a substantially continuous isolation region of one of said conductivity types also extending from said surface to form isolation junctions with regions of opposite conductivity types abutting the isolation regions. Substantially all isolation regions surrounding active and passive devices in the circuit have a uniform planar width.

The uniform width of the isolation regions appears to reduce stacking faults and similar crystallographic defects in epitaxial layers in which the integrated circuits are formed. Such faults contribute to "pipes."

INTEGRATED CIRCUIT JUNCTION ISOLATION STRUCTURE

Filed March 29, 1972 2 Sheets-Sheet 1

INTEGRATED CIRCUIT JUNCTION ISOLATION STRUCTURE

Original Filed March 29, 1972 2 Sheets-Sheet 1